(12) United States Patent
Hommen et al.

(10) Patent No.: US 7,186,484 B2
(45) Date of Patent: Mar. 6, 2007

(54) METHOD FOR DETERMINING THE RELATIVE POSITIONAL ACCURACY OF TWO STRUCTURE ELEMENTS ON A WAFER

(75) Inventors: Heiko Hommen, Dresden (DE); Jens Stäcker, Dresden (DE); Maria de la Piedad Fernandez-Martinez, Dresden (DE); Jens Uwe Bruch, Dresden (DE); Thorsten Schedel, Dresden (DE)

(73) Assignee: Infineon Technologies AG, Munich (DE)

( * ) Notice: Subject to any disclaimer, the term of this patent is extended or adjusted under 35 U.S.C. 154(b) by 344 days.

(21) Appl. No.: 10/950,165

(22) Filed: Sep. 24, 2004

(65) Prior Publication Data

US 2005/0260510 A1 Nov. 24, 2005

(30) Foreign Application Priority Data

Sep. 26, 2003 (DE) ................................ 103 44 850

(51) Int. Cl.
 *G03F 9/00* (2006.01)
(52) U.S. Cl. .......................... 430/22; 430/30; 324/718; 382/151
(58) Field of Classification Search ................ 430/22, 430/30; 324/713, 718; 382/151
 See application file for complete search history.

(56) References Cited

U.S. PATENT DOCUMENTS

| 4,437,760 A | 3/1984 | Ausschnitt |
| 4,538,105 A | 8/1985 | Ausschnitt |
| 5,916,715 A * | 6/1999 | Fulford et al. ................ 430/22 |
| 6,288,556 B1 | 9/2001 | Sato et al. |

* cited by examiner

*Primary Examiner*—Christopher G. Young
(74) *Attorney, Agent, or Firm*—Slater & Matsil, L.L.P.

(57) ABSTRACT

A measurement mark (3) for determining the relative positional accuracy of a progressive projection onto a wafer (5), the projection being performed with two masks (3, 4), comprising two structure elements (10, 20) formed on a respective one of the masks (1, 2). The structure elements (10, 20) overlap with regard to their position on the masks so that, during the projection of the second structure element (20), an electrically conductive structure (30) formed on the basis of the first structure element on the wafer (5) is overformed by removal of a portion (31). In an electrical line width measurement, the reduced width (CD, $CD_{30a}$) of the structure (30) is measured and compared either with the original width (62) or with that width ($CD_{30b}$) of a further partial element (30b) produced by the overforming.

11 Claims, 7 Drawing Sheets

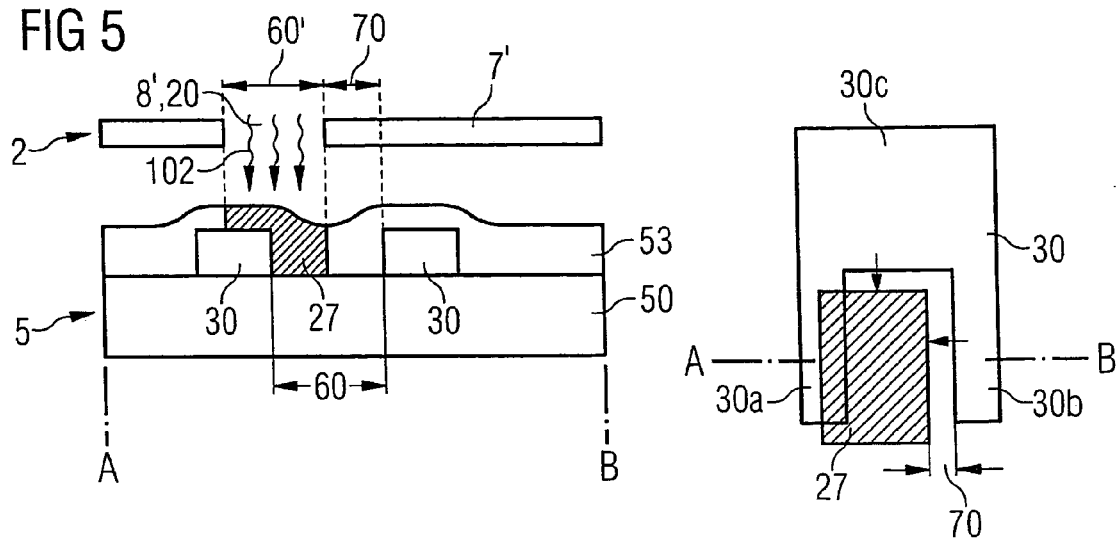
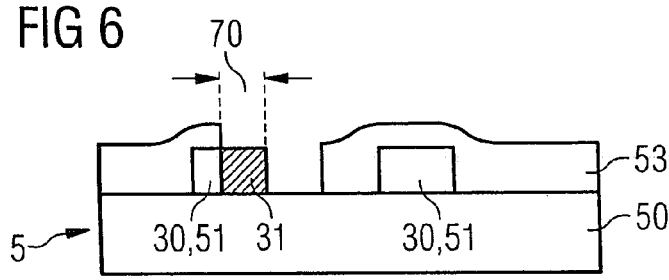
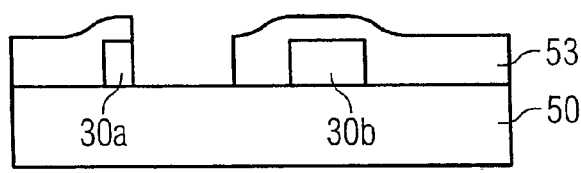
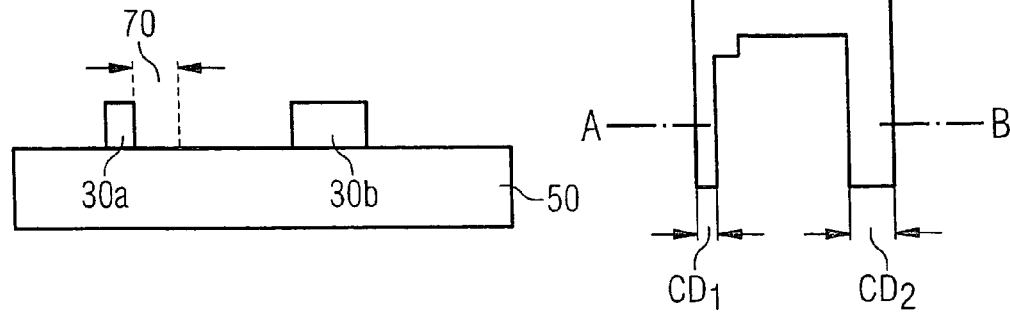

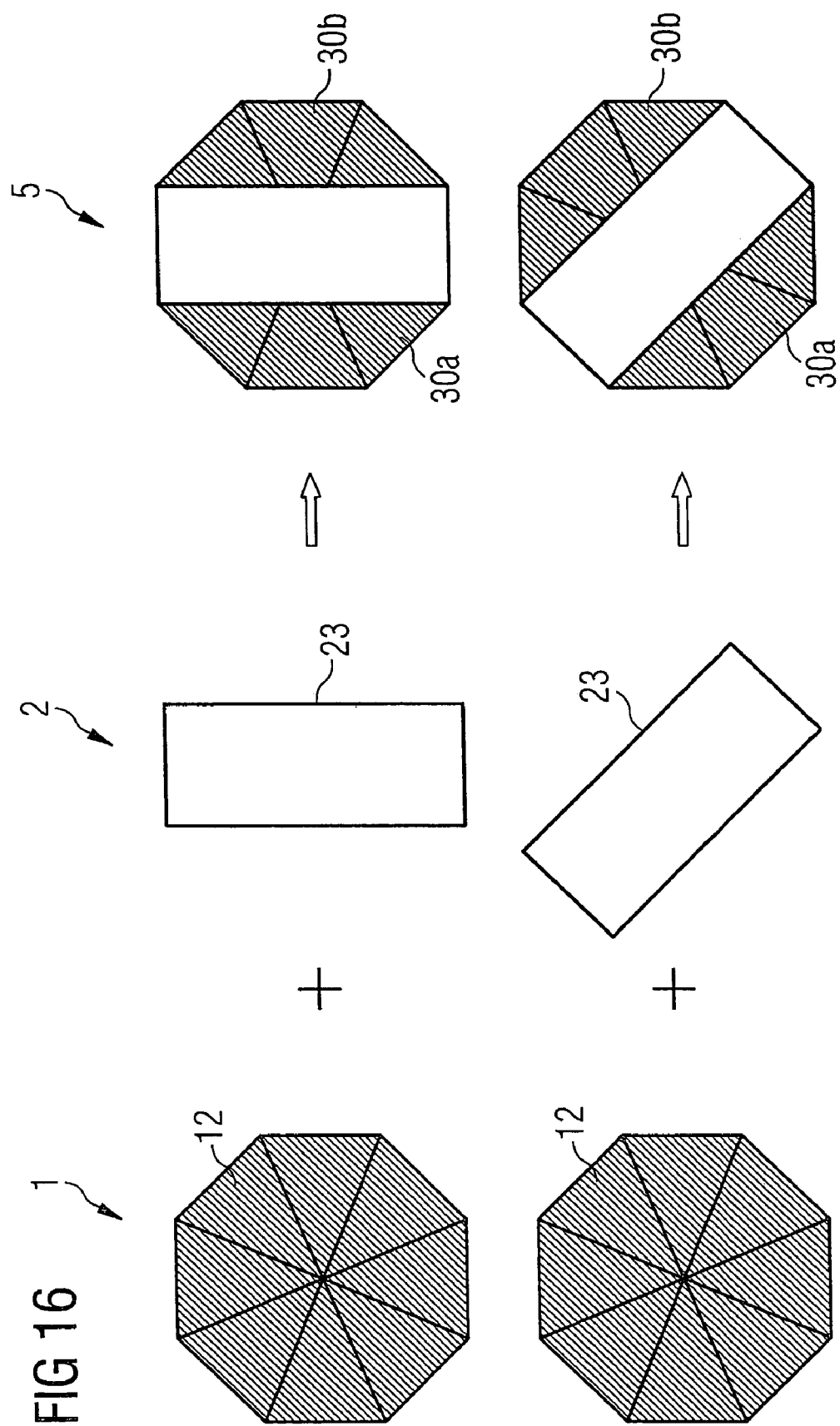

METHOD FOR DETERMINING THE RELATIVE POSITIONAL ACCURACY OF TWO STRUCTURE ELEMENTS ON A WAFER

This application claims priority to German Patent Application 103 44 850.0, which was filed Sep. 26, 2003 and is incorporated herein by reference.

TECHNICAL FIELD

The invention relates to a method for determining the relative positional accuracy of two structure elements that are to be imaged onto a wafer from a respective mask. The invention relates in particular to the determination of the positional accuracy of two structure patterns that are projected onto a wafer progressively from a mask and in each case have one of the structure elements. The invention additionally relates to the determination of the quality and characterization of the imaging behavior in a projection apparatus.

BACKGROUND

In addition to the measurement of line widths or further variables that characterize individual structures, the measurement of absolute and relative positional accuracies of the respectively projected structure patterns also plays an important part in semiconductor fabrication. In particular, a high degree of a relative positional accuracy of a structure pattern with respect to a previously imaged structure pattern ensures the function of the relevant circuit and thus a high yield.

Relative positional accuracies are usually determined by means of measurement marks inserted into the structure patterns specifically for this purpose. In principle, this involves measuring the offset of a second measurement mark part, which is formed in an upper layer on the wafer, with respect to a first measurement mark part formed in an underlying layer. The measurement is carried out, e.g., in a measuring microscope (overlay measuring device) operating under optical light (also ultraviolet light). A detailed measurement in a scanning electron microscope (SEM) is equally possible.

Structures suitable for such a measurement are the so-called box-in-box structures, for example. A measurement mark part comprising four bars combined to form a quadrangle is formed in each of the two layers. The quadrangle of one layer has a different diameter from the quadrangle of the other layer, so that the two quadrangles are nested in one another about a common midpoint in the case of an ideal imaging. The bars, i.e., the structure elements of the underlying layer, can be detected by the measuring device either because the upper layer has a degree of transparency, or because the depression caused by the bars or the ridge is reflected in the topography of the overlying layer.

If an imaging error is present, then the two measurement mark parts are imaged with a relative offset with respect to one another, it being possible to read this offset directly with the aid of the measuring device with the altered bar position within the wafer plane (XY plane). The imaging error may be caused for example by lens aberrations, by vibrations or by shocks while carrying out the projection step, but also by problems during postprocessing—for example etching, polishing deposition processes, etc. The last-mentioned problems are imaging errors in the broader sense since the processes mentioned only lead to an apparent displacement of the measurement mark parts or structures within the wafer plane. In the case of the so-called "snowdrift effect," increased deposition thicknesses are obtained during the deposition in a preferred direction around, e.g., elevated structures, the form of said deposition thicknesses being reminiscent of the "snowdrifts" mentioned. If the position of the measurement mark part is then determined solely from the surface topography, then an apparently displaced measurement mark is present.

The polishing process may give rise to an edge removal and thus to a reduction of contrast at the edges of the bars. In the case of elevated structures of a measurement mark part, that edge of a bar structure which faces the respective polishing direction is affected by the degradation to a greater extent than the edge remote from the polishing direction.

Precisely those apparent imaging errors caused by postprocessing can be detected, and thus taken into account, only with very great difficulty by optical measuring devices for determining the positional accuracy.

A further problem arises from the fact that the ongoing reduction of widths with which structures in a semiconductor circuit are to be fabricated in order to increase the integration density is advancing faster, on account of progress in the area of lithographic imaging, than is possible through an improved resolution of the optical measuring devices in the area of metrology in the context of detecting structures with corresponding widths. Tolerances with regard to the positional accuracy of 10 nm are prescribed in the case of the 110 nm technology generation. However, a measurement uncertainty of 1–3 nm already has to be taken into account on the part of the measuring devices. A transition to reduced tolerance limits of 8 nm or less is already expected in the near future, particularly if the transition to the 90 nm or 70 nm technology generation is accomplished. The relative proportion made up by the measurement uncertainty in the tolerance budget accordingly increases, which is not acceptable in the long term.

As an alternative, it is possible to carry out measurements using scanning electron microscopes; for a fast inline measurement within production, however, this alternative is not taken into consideration in view of the high outlay and the associated prolonged production time.

SUMMARY OF THE INVENTION

In one aspect, the present invention offers a fast and inexpensive measurement of the relative positional accuracy of successively imaged structure elements/structure patterns, which enables measurement accuracies of 1 nm or less.

In a preferred embodiment, a method determines the relative positional accuracy of two structure elements to be imaged onto a wafer from a respective mask. The wafer includes a conductive layer and a resist. The first structure element is projected from a first mask, thereby exposing the resist in a first patch. The patch is developed and transferred into the conductive layer, thereby forming an electrically conductive structure. The first resist is removed and a second resist is applied. The second structure element is projected from a second mask for the purpose of exposing the resist in a second patch above the electrically conductive structure with an offset with respect to the electrically conductive structure. The offset is dependent on an imaging error. The second patch is developed and transferred into the conductive layer, thereby removing a portion of the electrically conductive structure. The size of the removed portion represents the size of the offset. An electrical measurement of the line width is carried out at the electrically conductive structure. The offset from the result of the electrical measurement of the line width is calculated in order to determine the positional accuracy.

The technique of electrical line width measurement (ELM) is used. Such a technique involves using moveable tips to apply currents and/or voltages to different points of the structure to be measured. By prescribing the geometrical form, the material property of the resistivity, and also the precise positions on or at the structure at which the tips make contact with the structure, it is possible to determine with very high accuracy from the current and/or voltage measurements the resistances and, from the latter, the structure dimensions that are still unknown prior to the measurement. In the electrical line width measurement, it is generally possible to prescribe the structure heights (layer thicknesses) and lengths, while the widths parameter to be determined are still open. The only prerequisite for carrying out a measurement is that the relevant structure comprises an electrically conductive material.

Carrying out a measurement of positional accuracy with the aid of the method of electrical line width measurement becomes possible by virtue of the fact that an electrically conductive structure defined in a first projection step is directly modified on account of a second projection step. In other words, the width of the electrically conductive structure is reduced. The degree of reduction is a measure of the offset of the structure elements of the second projection step or of the second mask with respect to the structure elements of the first projection step or of the first mask during an imaging. In particular, the size of the removed portion of the electrically conductive structure, for example the width of the removed portion or the basic area of the removed portion, is dependent on the size of the offset. Preferably, the size (for instance the width or the basic area) of the removed portion is proportional to the size of the offset.

The structure elements of the first and second masks, which structure elements are to be considered as measurement marks, are accordingly arranged such that they overlap on account of their positions or, in the case of an ideal imaging, at least directly adjoin one another if they are projected into the wafer plane. This property constitutes a crucial difference from the measurement marks in accordance with the prior art, in the case of which the structure elements of the respective planes must precisely not overlap in order that the distance between them can be determined by the microscope measuring device.

It is preferably provided that the removal of the portion of the electrically conductive structure reduces the width of the electrically conductive structure, the degree to which the width of the electrically conductive structure is reduced depending on the size of the offset. In this case, the width of the electrically conductive structure denotes the maximum distance between a first outer edge and an opposite, second outer edge of the electrically conductive structure. The removal of a portion of the electrically conductive structure, the size of which depends on the size of the offset, alters the electrically conductive structure such that, after the removal of the portion, the distance between the outer first edge and the outer second edge of the remaining electrically conductive structure is less than before the removal of the portion of the electrically conductive structure.

According to embodiments of the invention, a measurement mark comprising two structure elements, i.e., measurement mark parts, which positionally overlap or adjoin one another and are distributed between different masks is accordingly combined with the method of electrical line width measurement. Further advantageous refinements can be gathered from the dependent claims.

BRIEF DESCRIPTION OF THE DRAWINGS

The invention will now be explained in more detail using exemplary embodiments with the aid of a drawing, in which:

FIGS. 1 to 8 show, in cross-sectional profiles and also in some instances in plan view on the right-hand side, the process sequence for transferring a measurement mark representing the offset of two imagings;

FIG. 16 is like FIG. 15, but combined in a contiguous structure for measuring the angle dependence of a positional displacement.

Figure 1:
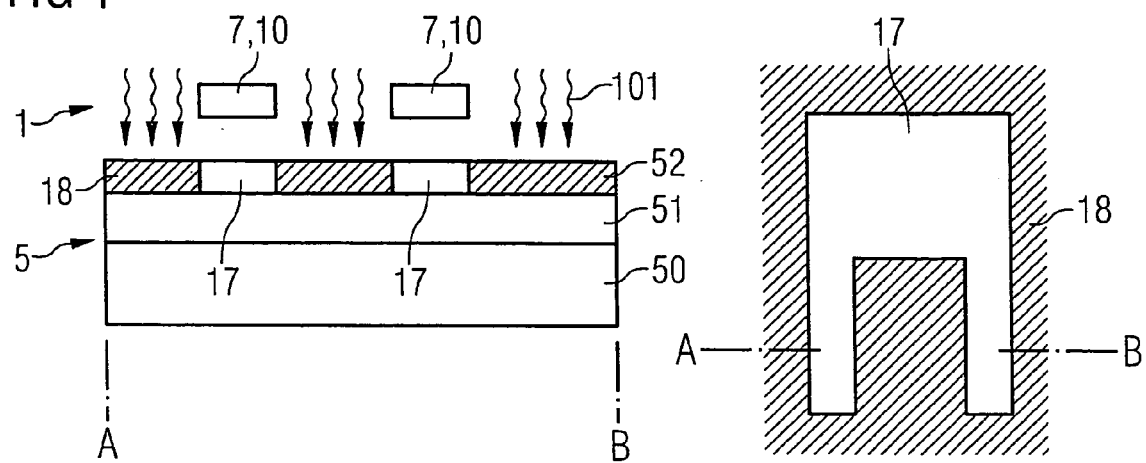

LIST OF REFERENCE SYMBOLS 1, 2 Masks
3, 4 Measurement marks
5 Wafer
7 Opaque area on mask
8 Transparent area on mask
10, 11 First structure element
17, 27 Unexposed resist structure
18, 28 Exposed resist structure
19 Opening in first structure element
20, 21 Second structure element
22 Opaque areas on second structure element
30 Electrically conductive structure
30a Ridge, partial element of the electrically conductive structure conductive structure
30b Ridge, partial element of the electrically conductive structure
30c Pad structure, connecting the first and second partial elements
31 Removed portion of the electrically conductive structure
50 Substrate
51 Electrically conductive layer
52 First resist
53 Second resist
60 Width of the opening in first structure element
60' Width of the second structure element (1st example)
61 Width of the second structure element (2nd example)
62 Width of the first structure element (2nd example)

70 Offset
81–88 Pads for tip measurement
101, 102 Light beam for exposure/projection
150 Electrically conductive pad structure
$CD_{30a}$, $CD_{30b}$ Width of the partial elements
d Thickness of the electrically conductive layer
L Length of the electrically
CD Width of the electrically conductive structure
$\rho$ Resistivity
$\rho_s$ Sheet resistivity
$\alpha$ Angle between measurement marks

DETAILED DESCRIPTION OF ILLUSTRATIVE EMBODIMENTS

Figure 9:
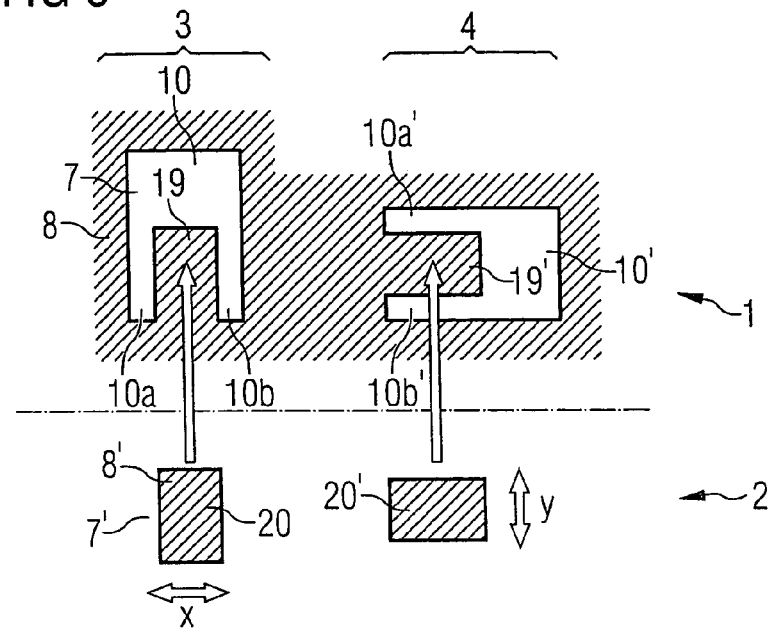
FIG. 9 shows the measurement marks formed on a first mask (illustration at the top) and second mask (illustration at the bottom) for the purpose of determining the offset in the X and Y directions.

FIG. 9 shows two measurement marks 3, 4 for determining the positional accuracy in accordance with a first exemplary embodiment that will be explained below. Each of the two measurement marks 3, 4 comprise two structure elements 10, 20 and 10', 20', respectively, which are distributed on two different masks 1, 2. The patch illustrated above the dash-dotted line comprises the structure elements or measurement mark parts 10, 10' on the first mask 1. These first structure elements 10, 10' are patterned as opaque areas 7 on the first mask 1 and surrounded by transparent areas 8.

The first structure elements 10, 10' are assigned second structure elements 20, 20' on the second mask 2. The positions thereof respectively correspond to one another, i.e., when the masks are placed one on the other, the structure elements 10 and 20, and respectively 10' and 20', overlap or directly adjoin one another.

Such positional correspondence may be discernable for example from systems of coordinates that can be applied on the respective masks. The structure elements 20, 20' formed on the second mask 2 as transparent areas 8' in opaque surroundings 7' have a geometrical form such that they fit precisely in openings 19, 19' within the opaque structure elements 10, 10' on the first mask.

In the case of an ideal imaging double exposure of both masks 1, 2, the resist structures shaded by the opaque structure elements 10, 10' on a wafer would not be postexposed through the transparent structure elements 20, 20' of the second mask. However, an imaging error that is present, on the other hand, in the X direction would lead to an impairment of the resist structures formed by the narrow ridges 10a, 10b, depending on whether an error is present in the positive or negative X direction. The same applies to the Y measurement mark 4—shown on the right-hand side of FIG. 9—with regard to the narrow ridges 10a', 10b'.

The process sequence with an imaging of the measurement mark 3 into an electrically conductive structure on the wafer will now be explained with reference to FIGS. 1 to 8.

FIG. 1 shows a first step of the projection of the first mask shown in FIG. 9 onto a wafer 5. The wafer 5 comprises a substrate 50, on which a layer 51 having electrically conductive material and also a photosensitive resist 52 are arranged. The cross-sectional profile can be seen on the left-hand side of FIG. 1, and the plan view of the structure produced in the resist can be seen on the right-hand side. The projection may be performed in a wafer scanner with light 101 having any desired wavelength, for example 193 nm. The cross-sectional profile is depicted along a line AB.

The projection transfers the structure element 10 on the mask 1 into unexposed resist structures 17 on the wafer 5. The unexposed resist structures 17 form a patch in the resist 52 which is surrounded by exposed resist structures 18.

Figure 2:
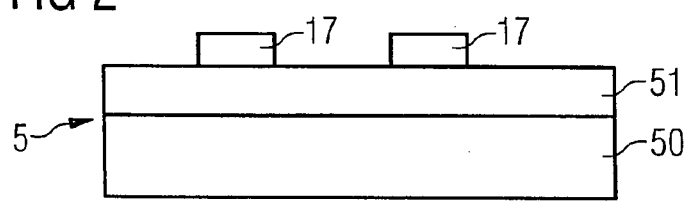

FIG. 2 shows the state after carrying out a developer step. The exposed patch 18 in the resist 52 has been removed in the process. Parts of the electrically conductive layer 51 are now uncovered at the surface of the wafer 5.

Figure 3:
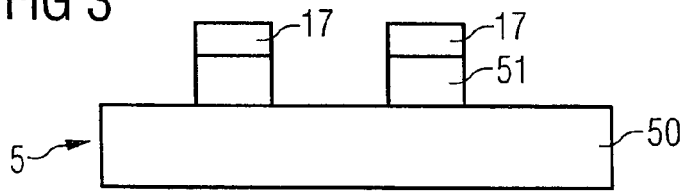

FIG. 3 shows the state after carrying out an etching step that transfers the patch of the unexposed resist structures 17 as resist mask into the electrically conductive layer 51.

Figure 4:
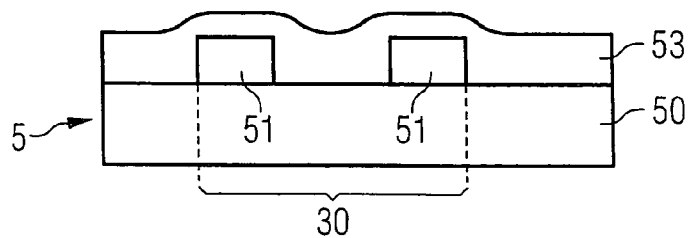

FIG. 4 shows the state after the removal of the developed resist structures 17 and the renewed application of a resist layer 53 onto the wafer 5. Steps that are to be carried out in a customary manner, such as cleaning or additional application of an antireflection layer, etc., will not be explained in any further detail at this point. It is clear to the expert skilled in the technical field of metrology and semiconductor fabrication that, in detail, further steps may be necessary for fabricating the desired structures.

The conductive layer 51 illustrated in FIGS. 3 and 4, after its patterning, forms the electrically conductive structure 30 that is still to be measured. Its geometrical form now corresponds precisely to that of the resist structure 17 shown on the right-hand side of FIG. 1.

FIG. 5 shows the step of the projection of the structure element 20, i.e., transparent area 8' is formed in opaque surroundings 7' on the second mask, onto the wafer 5. In this case, the light 102 of the same or a different wafer scanner falls through the transparent area 8' of the mask 2 onto the resist 53 and leads to the exposure of a resist structure 27 in the second photosensitive layer 53.

Since, as has already been explained in the description regarding FIG. 9, the dimensions of the structure element 20 are adapted to the dimensions of the opening 19 in the structure element 10, the width 60 of the interspace between the two ridges of the electrically conductive structure 30 and the width 60' of the transparent area 8' or the resist structure 27 essentially correspond to one another. However, on account of an imaging error, an offset 70—in this case in the X direction (cf. FIG. 9)—is present between the positions of the electrically conductive structure 30 and the exposed patch of the resist structures 27. It should be noted that FIGS. 1 to 8 are merely diagrammatic illustrations, the imaging error generally not resulting from a displacement of the mask with respect to the wafer 5, but rather for example due to lens imaging or postprocessing errors.

This exemplary embodiment does not involve, in particular, a contact exposure, which is possibly suggested by FIG. 5. A lens system that is not shown in these figures is arranged between the mask 2 and the wafer 5 and, moreover, brings about an imaging that is demagnifying by the factor 4 or 5.

The patch of the exposed resist structure 27 and also the offset 70 between the exposed patch and the electrically conductive structure 30 can be seen in plan view on the right-hand side of FIG. 5.

FIG. 6 shows the state after developing the photosensitive resist 53 and removing the exposed resist structure 27. An etching step is once again affected in order to transfer the now developed patch into the electrically conductive layer 51 or the electrically conductive structure 30. A portion 31 of the electrically conductive structure 30 is thereby removed on account of the offset 70 (FIG. 7).

FIG. 8 shows the state after removing the remaining parts of the resist 53. The electrically conductive structure 30 is now present in elevated fashion on the substrate 50 and comprises an extended pad 30c and also a first ridge 30a and a second ridge 30b (cf. FIG. 5). The first ridge 30a, which can be seen on the left-hand side in the cross-sectional profile, has been reduced in terms of its width $CD_1$ by the magnitude of the offset 70 on account of the imaging error. By contrast, the second ridge 30b on the right-hand side of the cross-sectional profile has remained unimpaired. It has its original width $CD_2$. The ridges 30a, 30b embodied with the same width $CD_1$, $CD_2$ in this exemplary embodiment thus differ after the second projection step has been carried out, on account of the imaging error, as can be seen in FIG. 8. By measuring the line widths and comparing them, it is accordingly possible to deduce the offset and thus the imaging error. This measurement is advantageously effected on the basis of the electrical line width measurement. The van der Pauw method is employed. For this purpose, tips are applied to the pad 30c and to the line ends of the ridges 30a and 30b and currents or voltages are applied.

Figure 10:
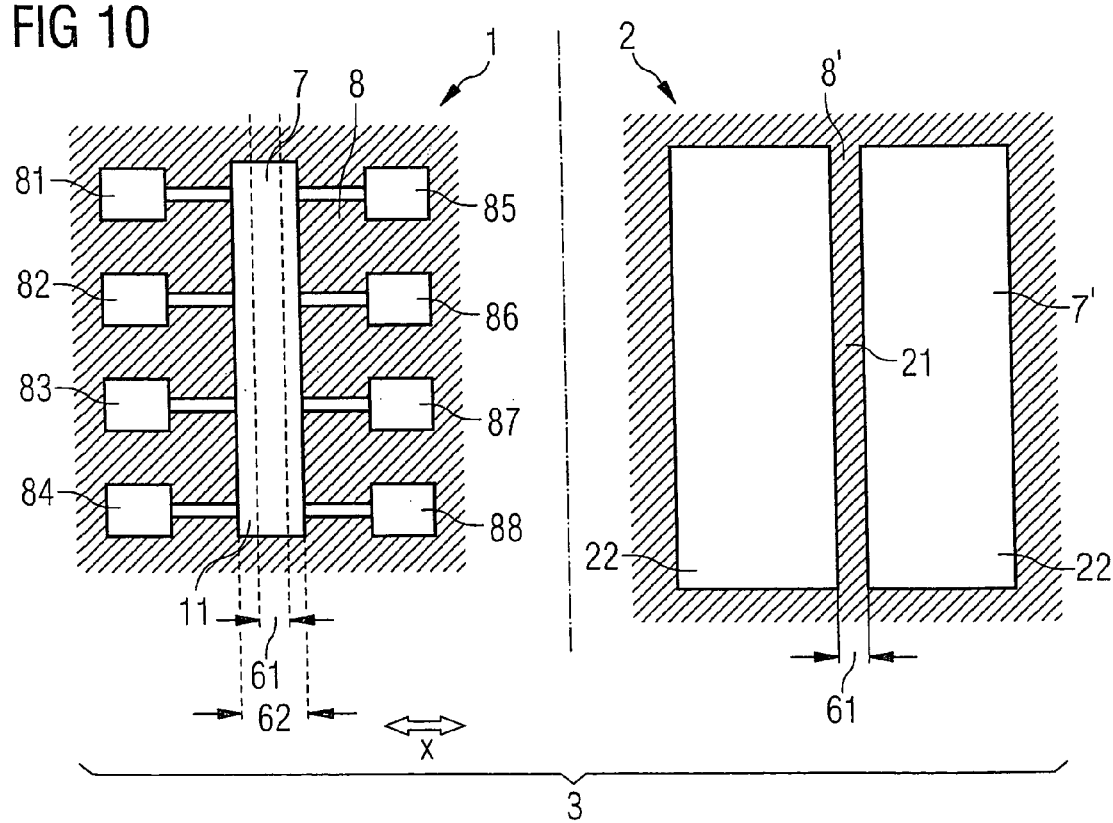
FIG. 10 shows a further exemplary embodiment of a measurement mark formed on a first mask (left) and second mask (right) according to the invention.

The performance of the electrical line width measurement will be explained in more detail on the basis of a second exemplary embodiment. FIG. 10 shows a measurement mark with a first structure element 11 on the first mask 1 and a second structure element 21 on the second mask 2. The positions of the structure elements 11 and 21 on their respective masks 1 and 2 are assigned to one another in such a way that the transparent structure element 21 of the second mask 2 is imaged centrally onto the opaque structure element 11 of the first mask in the case of a projection onto the wafer 5. In accordance with this second exemplary embodiment, the measurement mark parts overlap even in the case of an ideal imaging. In the first exemplary embodiment, by contrast, they directly adjoined one another and overlapped only given the presence of an imaging error.

As a result, a portion of the electrically conductive structure 30 formed by the structure element 11 (analogously to FIGS. 1 to 8) is always removed during the second projection. Depending on the offset in the positive or negative X direction, the electrically conductive structure 30 defined by the structure element 11 is not only separated into two parts (indicated by the dashed lines in FIG. 10), rather the two parts are left with different widths, depending on the offset, after the etching process. The only prerequisite is that the width 61 of the transparent structure element 21 is less than the width 62 of the opaque first structure element 11 on the first mask 1.

Figure 11:
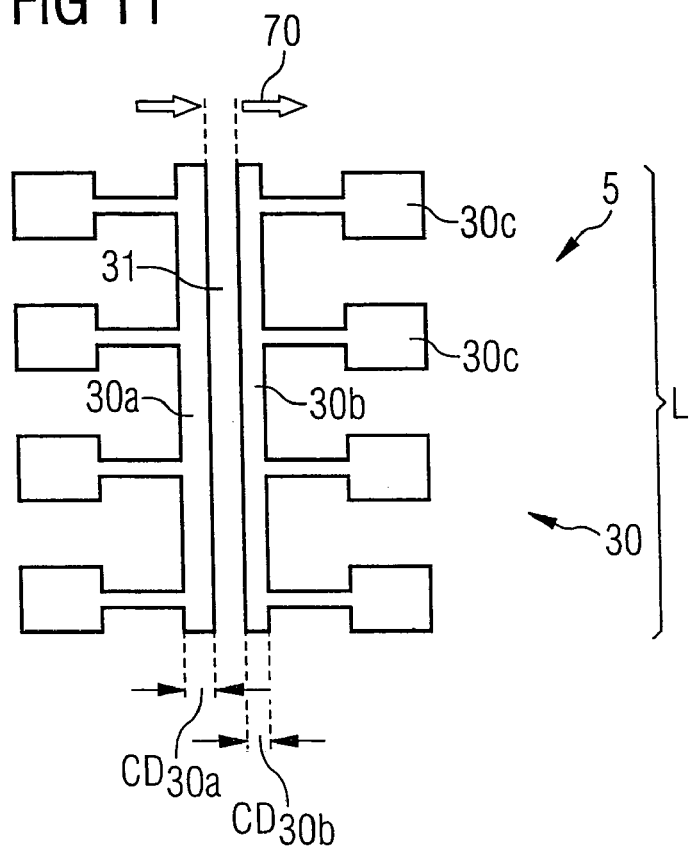
FIG. 11 shows a plan view of the measurement structure formed with the measurement mark according to FIG. 10 on a wafer.

FIG. 11 shows the result for the electrically conductive structure 30 on the wafer 5 after carrying out the steps according to the invention on the basis of the measurement mark 3 shown in FIG. 10. A portion 31 of the electrically conductive structure 30 originally formed after the first projection has already been removed in the state shown in FIG. 11. As a result of an offset 70 on account of an imaging error, the portion 31 has not been removed centrally, so that the width $CD_1$ of the left-hand partial ridge 30a is greater than the width $CD_2$ of the right-hand partial ridge 30b of the electrically conductive structure 30.

In order to carry out the electrical line width measurement, with the measurement mark 3, pads 81 to 84, 85 to 88 (see FIG. 10) with the first structure element 11 from the first mask 1 are concomitantly transferred into the electrically conductive layer 51. The second structure element 21 therefore additionally has opaque areas 22 that are at least large enough that the pads 30c transferred into the electrically conductive layer 51 cannot be postexposed and therefore cannot be removed. The pads 30c serve for connection for the tips used to apply currents and voltages in an electrical line width measurement.

Figure 12A:
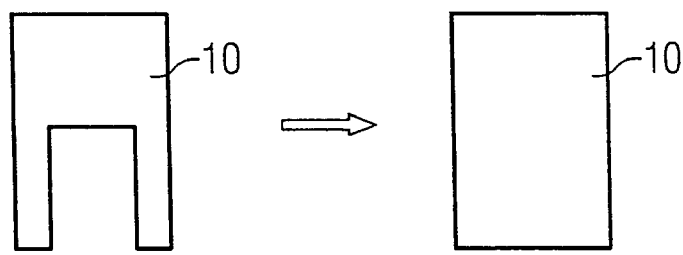
FIG. 12, consisting of FIGS. 12a and 12b, shows further variants of the measurement marks shown in FIGS. 9 and 10.
Figure 12B:
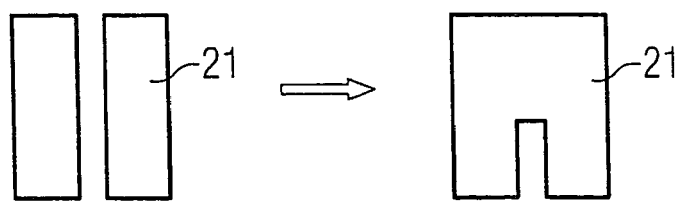

Before a method for electrical line width measurement is discussed in detail, it should also be pointed out that the invention is not restricted to the measurement marks 3, 4 illustrated in FIGS. 9 and 10, rather, any desired structure element combinations are possible in which the second structure elements 20, 21, 22 lead to an overforming of the electrically conductive structures formed by first structure elements 10, 11 in projection steps. FIG. 12 shows further exemplary replacements of the embodiments illustrated in FIG. 9 or 10.

The van der Pauw method enables the electrical measurement respectively of the widths $CD_1$ and $CD_2$ by application of tips to the pads 30c respectively of the ridges 30a and 30b. The method is sufficiently known from the prior art. The invention is not restricted to an electrical measurement of the line width on the basis of the van der Pauw method, rather what is crucial is that an item of information about one of the geometrical dimensions, such as the width CD, for instance, can be obtained by measuring an electrical characteristic of the overformed electrically conductive structure 30.

Figure 13:
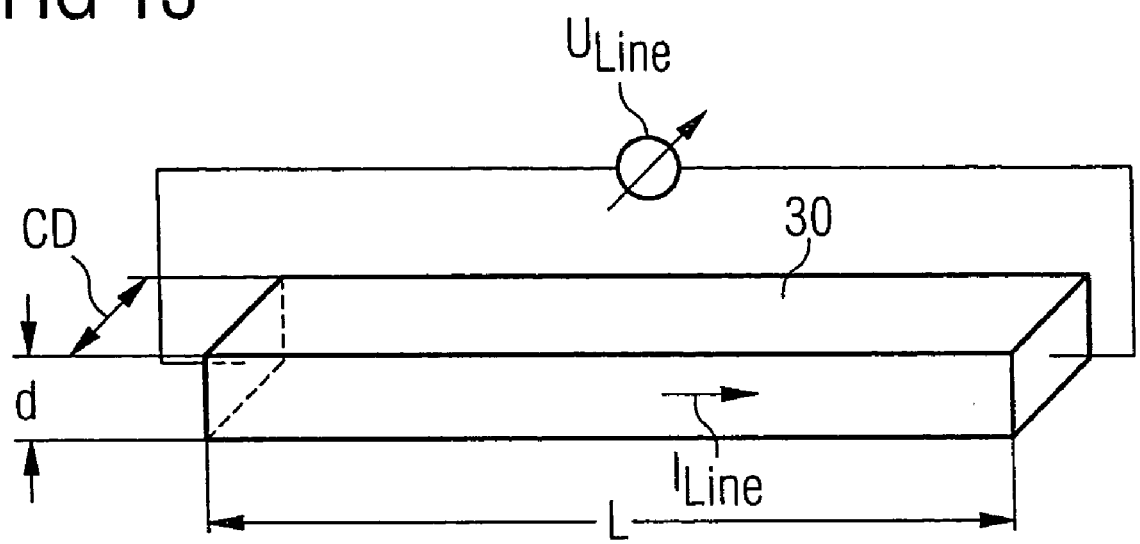
FIG. 13 shows a sketch of the electrically conductive structure for measurement according to the van der Pauw method.

FIG. 13 shows an electrically conductive structure 30 that is formed as a line and is arranged, for example, in elevated fashion on a surface of the substrate 50. The line has a length L, a height d, corresponding to the layer thickness of the electrically conductive layer 51, and a width CD. A voltage $U_{line}$ may be applied to the ends of the electrically conductive structure 30, so that a current $I_{line}$ flows through the electrically conductive structure 30. According to Ohm's law, the following holds true:

$$R_{line} = \frac{U_{line}}{I_{line}}.$$

where $R_{line}$ denotes the nonreactive resistance of the line. The following analogously holds true for the structure elements 30a, 30b shown in FIG. 11:

$$R_{30a} = \frac{U_{30a}}{I_{30a}}, R_{30b} = \frac{U_{30b}}{I_{30b}}.$$

After the splitting of the structure element 11 imaged onto the wafer on account of the projection of the second structure element 21, the two residual ridges 30a, 30b comprise the same conductive material. The resistances $R_{30a}$ and $R_{30b}$ furthermore depend on the structure dimensions CD, d, L of the divided ridges 30a, 30b. The lengths L and the layer heights d and also the resistivity ρ of the layer material are essentially identical in this case. Only the widths $CD_{30a}$ and $CD_{30b}$ differ. The following holds true, by way of example:

$$R_{30a} = \rho \frac{L}{CD_{30a} \cdot d} = \rho_s \frac{L}{CD_{30a}};$$

$\rho_s$ is the sheet resistivity and is measured in units [Ω/sq]. The resistivity ρ is measured in units [Ωm]. If no imaging error is present, then the ridges 30a, 30b are formed with identical line widths $CD_{30a}$, $CD_{30b}$ and the following holds true: $R_{30a}=R_{30b}$.

A qualitative result for the direction of the imaging error or offset 70 is obtained by direct comparison of the two measured resistances $R_{30a}$ and $R_{30b}$. If $R_{30a}$ is greater than $R_{30b}$, then an offset in the direction of the left-hand side in FIG. 11 is present. If $R_{30b}$ is greater than $R_{30a}$, then the case shown in FIG. 11 is present, i.e., an offset in the direction of the right-hand side of the figure.

A quantitative calculation requires the measurement of the sheet resistance. The latter is assumed to be constant over the entire wafer. The following holds true:

$$\rho_s = \frac{\rho}{d}.$$

Figure 14:
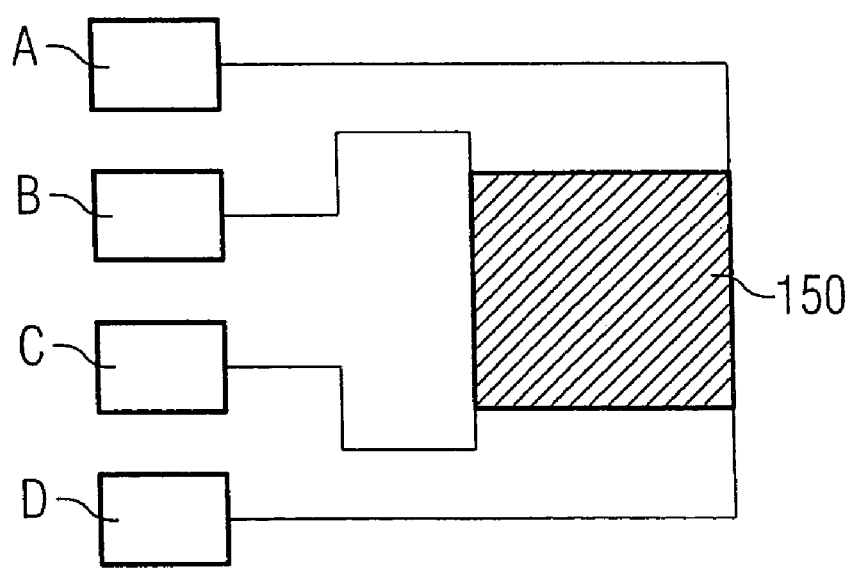
FIG. 14 shows an arrangement for determining the sheet resistance according to the van der Pauw method.

FIG. 14 illustrates the determination of the sheet resistance on the basis of a pass through the van der Pauw method. Pads A, B, C, D are arranged at the four corners of an electrically conductive pad structure 150 that is formed essentially in square fashion, the pads being respectively connected to the corners. The following holds true:

$$e^{\left(-\frac{\Pi \cdot R_{DC}}{\rho_s}\right)} + e^{\left(-\frac{\Pi \cdot R_{DA}}{\rho_s}\right)} = 1,$$

the resistances between the tip positions D and C, and D and A, being determined. It follows from this that:

$$\rho_s = \frac{n}{\ln 2} R_{VDP}.$$

It further holds true that:

$$R_{VDP} = \frac{R_{DC} + R_{DA}}{2} \cdot f\left(\frac{R_{DC}}{R_{DA}}\right) \text{ where } f\left(\frac{R_{DC}}{R_{DA}}\right) \approx 1.$$

$R_{VDP}$ is the so-called van der Pauw resistance. It can in turn readily be measured on the basis of the relationships $$R_{DC} = \frac{U_{BA}}{I_{DC}} \text{ and } R_{DA} = \frac{U_{BC}}{I_{DA}}$$

with the aid of the voltages and currents applied by the tips. The additional, square pad structure 150 (van der Pauw structure) may be arranged in the vicinity of the conductive structure 30 to be measured or the residual ridges 30a, 30b thereof on the wafer. It may be part of the measurement mark 3 and/or 4. In the case depicted in FIG. 9, it may be identical to the pad that connects the ridges 10a, 10b and 10a', 10b', respectively.

With the sheet resistance $\rho_s$ now known, the widths sought $$CD_{30a} = L \cdot \frac{\rho_s}{R_{30a}} \text{ and } CD_{30b} = L \cdot \frac{\rho_s}{R_{30b}}$$

can be determined by means of further electrical measurements at the ridges 30a, 30b of the conductive structure 30 with the aid of the tips.

An offset V in the negative (symbol "←") or positive (symbol "→") X direction can now be calculated for example as:

$$V_{\leftrightarrow} = \frac{CD_{30a} - CD_{30b}}{2},$$

in other words, exact knowledge of the original width of the electrically conductive structure is not necessary. A comparison of the width $CD_{30a}$ of the "right-hand" ridge 30a with that of the "left-hand" ridge 30b suffices.

However, the invention also includes the comparison of the width of only one ridge 30a or 30b with the original width 62, particularly when, e.g., only a single ridge is overformed in a second exposure.

Figure 15:
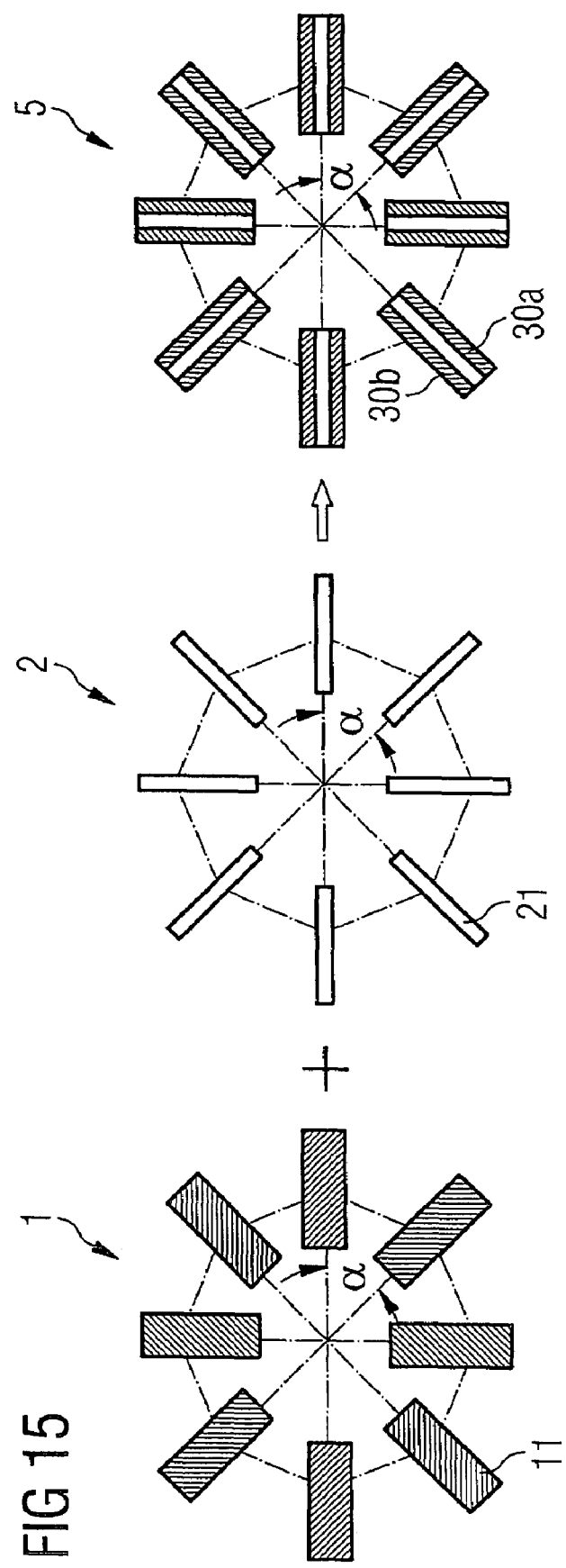
FIG. 15 shows an arrangement of measurement marks with structure elements on the first and second masks (left) and also the resulting structure on the wafer (right)

FIGS. 15 and 16 show advantageous exemplary embodiments of first and second structure elements and, on the right-hand side, the result with regard to the electrically conductive structure 30, or the ridges 30a, 30b thereof, which results when carrying out the method according to a preferred embodiment of the invention on the wafer 5. In this case, a multiplicity of structures are arranged in such a way that the offset can be determined for a multiplicity of directions, that is to say not only the X and Y directions as illustrated in FIG. 9. It is further provided that a multiplicity of the measurement structures 3 illustrated in FIG. 15 or 16 are arranged in a manner distributed over many positions of a reticle or a mask.

By means of the measurement structures according to embodiments of the invention and the application of the electrical line width measurement to the result of an exposure with the measurement marks, it is possible to carry out a detailed examination of the positional accuracy error. Consequently, it is subsequently possible to carry out a characterization of the device components leading to the imaging or of individual processes. Thus, it is possible, for example, to draw conclusions about lens aberrations or to detect focus errors. Moreover, it is possible to characterize chemical mechanical polishing processes or chemical deposition processes. One advantage arises from the fact that the present invention also enables such trials before the corresponding production processes are actually released.

Such an orientation-dependent arrangement of the measurement structures affords the extraordinary advantage of enabling a virtually complete lens characterization. In this case, it is also possible to select even finer angle subdivisions than those specified in FIGS. 15 and 16—where they are in each case 30 degrees.

Furthermore, it is also possible to carry out a statistical analysis on the basis of the measurement data determined, with regard to the yield. A corresponding correlation of the measurement data determined by electrical measurement, for example the determination of focus deviations over the image field which, after carrying out an etching process, on account of the sidewall angle usually present, have a considerably greater effect on the ultimate line width result than can be assumed after carrying out a measurement directly after a lithographic process. Problems in the lithography process are thus identified in good time.

It is possible, moreover, to position the measurement marks according to the invention directly in product masks, for example in the edge region of the chips or in the kerf region.

What is claimed is:

1. A method for determining the relative positional accuracy of two structure elements imaged onto a wafer from a respective mask, the method comprising:

providing the wafer with a substrate, on which a conductive layer and a resist are arranged:

projecting a first structure element from a first mask, thereby exposing the resist in a first patch;

developing and transferring the patch into the conductive layer, thereby forming an electrically conductive structure;

removing the first resist and applying a second resist;

projecting a second structure element from a second mask to expose the resist in a second patch above the electrically conductive structure with an offset with respect to the electrically conductive structure, said offset being dependent on an imaging error;

developing and transferring the second patch into the conductive layer, thereby removing a portion of the electrically conductive structure, a size of the removed portion representing a size of the offset;

carrying out an electrical measurement of the line width at the electrically conductive structure; and calculating the offset from the result of the electrical measurement of the line width in order to determine positional accuracy.

2. The method as claimed in claim 1 wherein carrying out the electrical measurement of the line width comprises applying voltages to different positions of the electrically conductive structure by means of moveable tips of an electrical measuring device.

3. The method as claimed in claim 2 wherein carrying out the electrical measurement comprises using at least four moveable tips for applying a respective voltage potential to a position of the electrically conductive structure and measuring currents flowing between the tips within the electrically conductive structure.

4. The method as claimed in claim 3 wherein carrying out the electrical measurement of the line width comprises determining nonreactive resistances within the electrically conductive structure from the applied voltages and the measured currents.

5. The method as claimed in claim 1 wherein carrying out the electrical measurement of the line width further comprises determining a sheet resistivity of the electrically conductive layer.

6. The method as claimed in claim 5 wherein the line width is calculated from the sheet resistivity a predetermined or measured length of the electrically conductive structure and a determined nonreactive resistance.

7. The method as claimed in claim 1 wherein the second patch is exposed with a second structure element in such a way that, after the removal of the portion representing the size of the offset, the electrically conductive structure has at least two partial elements, each partial element having a line width.

8. The method as claimed in claim 7 wherein an electrical measurement of the line width is carried out for each of the at least two partial elements.

9. The method as claimed in claim 8 wherein the measured line widths for each of the at least two elements are compared with one another and the offset is calculated from the comparison result.

10. The method as claimed in claim 1 wherein the removal of the portion of the electrically conductive structure reduces the width of the electrically conductive structure, the degree to which the width of the electrically conductive structure is reduced depending on the size of the offset.

11. The method as claimed in claim 1 and further comprising providing the first mask and the second mask, wherein the first mask has the first structure element and the second mask has a second structure element;

wherein the first structure element and the second structure element together form a measurement mark for determining the positional accuracy of an imaging performed with the two masks; and wherein the second structure element on the second mask with regard to the position on the respective mask is arranged in a manner overlapping the first structure element on the first mask in such a way that the first structure element, in the case of a projection onto a wafer, is decomposed into at least two partial elements respectively having a line width by a subsequent projection of the second structure element from the second mask.

* * * * *